(12) United States Patent
Hueting

(10) Patent No.: US 7,408,223 B2
(45) Date of Patent: Aug. 5, 2008

(54) TRENCH INSULATED GATE FIELD EFFECT TRANSISTOR

(75) Inventor: Raymond J. E. Hueting, Hengelo (NL)

(73) Assignee: NXP B.V., Eindhoven (NL)

( * ) Notice: Subject to any disclaimer, the term of this patent is extended or adjusted under 35 U.S.C. 154(b) by 329 days.

(21) Appl. No.: 10/580,624

(22) PCT Filed: Nov. 26, 2004

(86) PCT No.: PCT/IB2004/052561

§ 371 (c)(1),
(2), (4) Date: May 24, 2006

(87) PCT Pub. No.: WO2005/053031

PCT Pub. Date: Jun. 9, 2005

(65) Prior Publication Data

US 2007/0132014 A1    Jun. 14, 2007

(30) Foreign Application Priority Data

Nov. 29, 2003    (GB)    .................... 0327791.0

(51) Int. Cl.
*H01L 29/76*    (2006.01)

(52) U.S. Cl. ................ 257/328; 257/333; 257/E29.262
(58) Field of Classification Search ................ 257/328, 257/333, E29.027, E29.128, E29.133, E29.136, 257/E29.262
See application file for complete search history.

(56) References Cited

U.S. PATENT DOCUMENTS

2002/0036319 A1 *    3/2002    Baliga ........................ 257/328

OTHER PUBLICATIONS

Peake et al., "A novel high side FET with reduced switching losses," Power Semiconductor Devices and ICs, 2003. Proceedings. 2003 IEEE 15th International Symposium. Publication Date: Apr. 17, 2003.*

* cited by examiner

*Primary Examiner*—Thomas L Dickey
(74) *Attorney, Agent, or Firm*—Peter Zawilski

(57) ABSTRACT

The invention relates to a trench MOSFET with drain (8), sub-channel region (10) body (12) and source (14). The sub-channel region is doped to be the same conductivity type as the body (12), but of lower doping density. A field plate electrode (34) is provided adjacent to the sub-channel region (10) 10 and a gate electrode (32) next to the body (12).

9 Claims, 4 Drawing Sheets

TRENCH INSULATED GATE FIELD EFFECT TRANSISTOR

The invention relates to a trench insulated gate field effect transistor (IGFET), and particularly but not exclusively to a trench MOSFET (metal oxide semiconductor field effect transistor) structure suitable for use as Control and Sync FETs.

Low-voltage trench MOSFETs are commonly used, for example in voltage regulator modules (VRMs) in power supplies for electronic equipment such as personal computers. Commonly, a pair of MOSFETs are used, known as a Control FET and a Sync FET. The ideal characteristics of these FETs differ slightly. For the Sync FET the conduction power loss should be as low as possible. Since the conduction power loss is proportional to the specific on-resistance ($R_{ds,on}$) this parameter should be reduced. For the control FET on the other hand the switching loss should be minimized, which is proportional to the gate-drain charge density ($Q_{gd}$).

A figure of merit (FOM) has been defined as the multiple of $R_{ds,on}$ and $Q_{gd}$ to provide an indication of how suitable a transistor is in for use in VRMs. Note that the smaller the FOM the better. There is a need for structures that provide an improved figure of merit.

There is a drive to reduce the dimensions of trench MOSFETs, as for transistors generally. In the context of the devices considered here, the main benefit of this is to reduce the active area and so reduce $R_{ds,on}$. Such reduced size trench MOSFETs can be made, for example, using deep ultra-violet lithography.

However, this reduction in size is not necessarily attractive for the Control FET since in a conventional structure the gate drain charge density $Q_{gd}$ increases drastically with reduced size. Thus, simply reducing the size of the structure does not give improvements as large as might be expected.

There is thus a need for an improved structure to give improved properties of FETs for VRMs.

According to the invention there is provided an insulated gate field effect transistor, comprising: a source region of first conductivity type; a body region of second conductivity type opposite to the first conductivity type adjacent to the source region;

a sub-channel region of second conductivity type adjacent to the body region, wherein the doping in the body region is at least five times higher than the doping in the sub-channel region; a drain region of first conductivity type adjacent to the sub-channel region, so that body and sub-channel regions are arranged between the source and drain regions;

insulated trenches extending from the source region through the body region and into the sub-channel region, each trench having sidewalls, and including insulator on the sidewalls, at least one conductive gate electrode adjacent to the body region, and at least one conductive field plate electrode adjacent to the sub-channel region; and a gate terminal connected to the gate electrodes and a field plate terminal connected to the field plate electrodes to independently control the voltages on the gate electrodes and field plate electrodes.

Note two features of this structure. Firstly, instead of a drift region having the same conductivity type as the drain, a sub-channel region is used which has the opposite conductivity type to the drain and the same conductivity type as the body. Secondly, a field plate electrode with a separate terminal is provided adjacent to the sub-channel region.

The depth of field-plate trench should be either equal to or deeper than the sub-channel region.

By applying an appropriate voltage to the field plate electrode an inversion layer can be created in the sub-channel region thereby lowering the on-resistance of the device.

In some embodiments, the same thin insulator thickness is used for the gate and field plates to achieve a high carrier density in the inversion layer in the sub-channel layer and hence a low on-resistance.

In other embodiments, however, the thickness of the insulator adjacent to the field plate electrode is greater than the thickness of the insulator adjacent to the gate electrode. The greater insulator thickness reduces the carrier density in the inversion layer in the sub-channel region thereby increasing the on-resistance. However, the greater thickness significantly reduces the gate-drain charge density.

The doping concentration in the sub-channel region may be in the range $10^{15}$ to $5 \times 10^{16}$ cm$^{-3}$ and the doping concentration in the body region may be in the range $5 \times 10^{16}$ to $10^{18}$ cm$^{-3}$.

In embodiments, the doping concentration in the sub-channel region may be graded to be higher adjacent to the body region and lower adjacent to the drain region. This can help reduce the gate-drain charge density.

The invention is particularly applicable in vertical trench FETs. Accordingly, the insulated gate field effect transistor may be formed in a semiconductor body having opposed first and second major surfaces, wherein the source region is at the first major surface over the body region, the body. region is over the sub-channel region and the sub-channel region is over the drain region, and the trench extends from the first major surface towards the second major surface through the source, body and sub-channel regions.

Each trench may include a field plate electrode extending from a first major surface past the interface between the body region and sub-channel region and a pair of gate electrodes, one on each side of the field plate electrode, adjacent to the body region.

In particular, the gate electrode may be formed of a pair of polysilicon spacers on either side of the field plate electrode.

In another aspect, there is provided a use of the transistor described above, in particular including the steps of applying a fixed voltage to the field plate electrode, the fixed voltage being selected to create an inversion layer in the sub-channel when the transistor is on, to allow the sub-channel to sustain a source-drain voltage and to allow the threshold voltage of the transistor to be determined by the body layer, and applying a varying gate voltage to the gate control electrode to switch the transistor on and off.

Note that in this specification the term "over" is used for the direction towards the first major surface and "under" for the direction towards the second major surface without any orientation in space of the MOSFET being intended.

Embodiments of the invention will now be described, purely by way of example, with reference to the accompanying drawings in which.

Note that the drawings are schematic and not to scale. Like reference numerals are used for the same or similar features in different figures.

Figure 1:
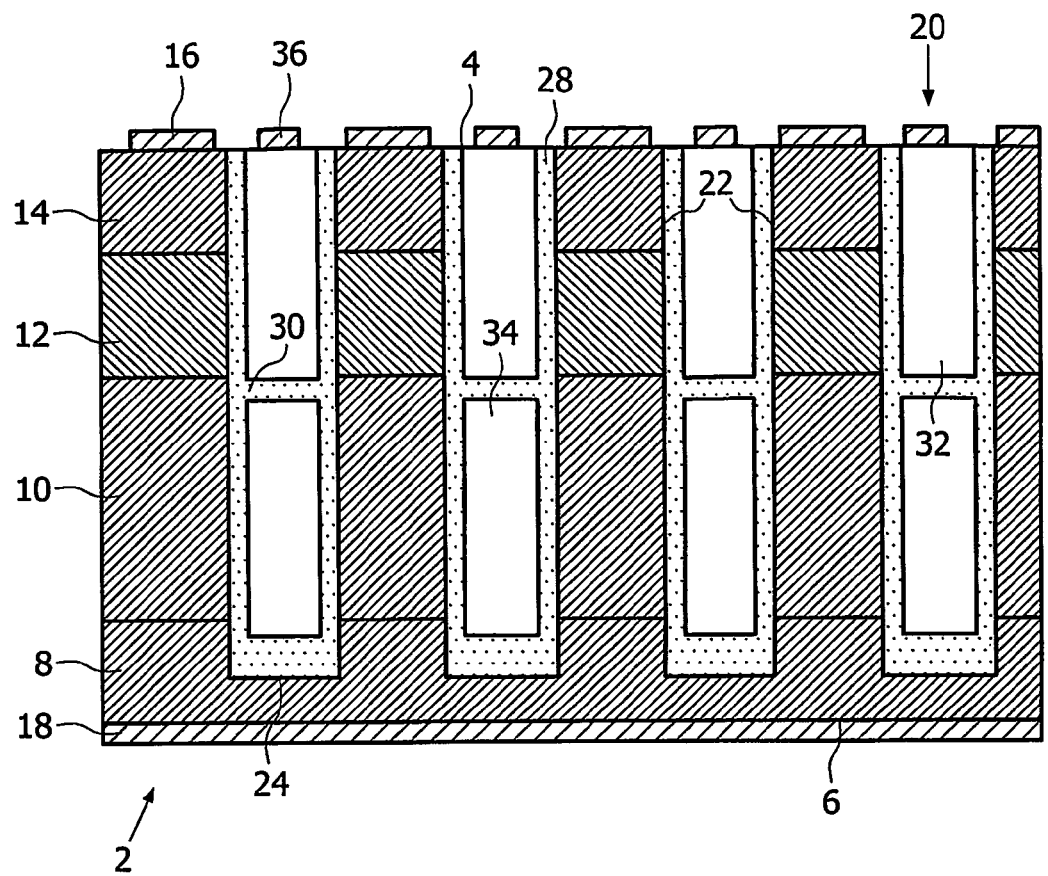
FIG. 1 shows a side cross-sectional view of a first embodiment of a MOSFET according to a first embodiment of the invention.

FIG. 1 shows a cross-section through a semiconductor device according to a first embodiment of the invention. A semiconductor body 2 has opposed first 4 and second 6 major surfaces. An n+ drain region 8 adjoins the second major surface. An p– sub-channel region 10 is provided on top of the drain region 8, a p body region 12 on top of the sub-channel region 10 and an n+ source region 14 on top of the body region 12. A source contact 16 is provided on the first major surface 4 to connect to the source region 14 and a drain contact 18 is provided on the second major surface 6 to connect to the drain region. The source contact 16 also connects to the body region 12 (see below).

A trench 20 extends from the first major surface 4 through the source region 14, the body region 12 and the sub-channel region 10, having sidewalls 22 and a base 24 adjacent to or deeper than the drain region-drift region interface 26. The trench extends substantially the full depth of the sub-channel region, since otherwise the electron channel would be interrupted with consequently a high Rds,on. Gate oxide 28 is provided on the sidewalls 22. Gate oxide 28 is also provided on the base of the trench 20, above which there is a conductive field plate 34. This is covered by insulator 30, above which in the same trench 20 is provided a conductive (e.g. polysilicon) gate 32 adjacent to the source region 14 and body region 12. A gate contact 36 connects to the gate 32 and a field plate contact 38 (see FIG. 2) contacts the field plate 34.

Figure 2:
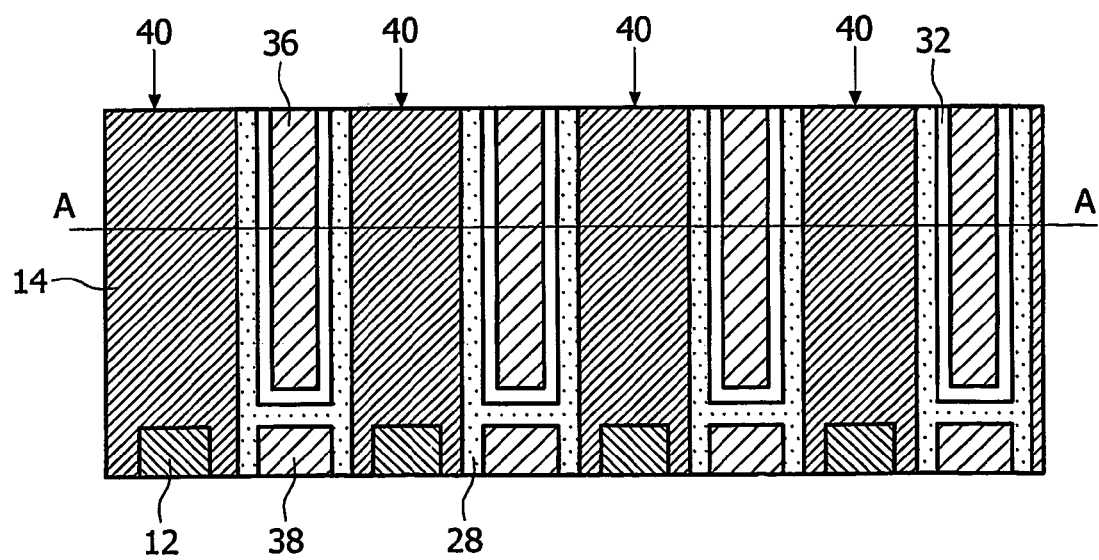
FIG. 2 shows a top view of the embodiment of FIG. 1.

As illustrated in FIG. 2, in the specific example, a plurality of cells 40 extend across the first major surface to define a plurality of stripes in which the source region 14 and trench 20 alternate. Lines A-A indicate where the section of FIG. 1 is taken.

FIG. 2 shows a field plate contact 38 to the field plate at one end of each of the stripes, as well as the exposure of the body region 12 at the first major surface 4. The body region 12 is connected to the source contact 16 in this exposed region. For clarity, the source contact 16 is not shown in FIG. 2.

The separate gate and field plate contacts 36, 38 allow the voltages on the gate 32 and the field plate 34 to be separately controlled.

In the example, the cell pitch is 0.5 micron, and the trench is 1.2 microns deep and 0.25 micron wide. The body layer 12 is doped to be p-type at a doping concentration of $10^{17}$ cm$^{-3}$ and the sub-channel 10 is doped to be p-type with a doping concentration $4 \times 10^{15}$ cm$^{-3}$. The body layer extends to a depth of 0.6 micron and the sub-channel layer 10 extends to a depth of 0.6 micron below that. The gate 32 extends to a depth of about 0.6 micron, and the field plate 34 extends next to the sub-channel, accordingly to a depth of about 1.2 microns. As will be appreciated, the depth of the gate 32 and field plate 34 are slightly less than that of the body layer 12 and sub-channel 10 because some of the depth is taken up by gate oxide 28 on the base and by the insulator 30. As the skilled person will appreciate, these size and doping values can be changed as required.

The doping levels are selected, firstly in order to sustain a high drain-source voltage and secondly to ensure that the threshold voltage is determined by the highly doped p-type body region so that the insulator 30 combined with is not important in the determination of the threshold voltage.

Calculations were carried out with a voltage of 12V applied to field plate terminal 38 and hence to the field plate 34. The results give a threshold voltage of 2V and a breakdown voltage of 24V, with the breakdown near the p-body junction. A value of $R_{ds,on}$ of 0.8 mΩ.mm$^2$ excluding the substrate resistance has been calculated for a gate-source voltage of 10V and $Q_{gd}$ has been calculated to be 3.3 nC/mm$^2$ for a drain-source voltage of 12V. This gives a figure of merit of 2.5 mΩ.nC. This compares to 6.3 mΩ.nC for a conventional trench MOSFET with a 200nm thick trench base oxide, the same pitch, trench width and breakdown voltage as the example but with a constant drift doping density.

The major improvement here is in the $R_{ds,on}$ value with the $Q_{gd}$ value being largely unchanged.

The invention can thus give very significantly improved figures of merit.

Figure 3:
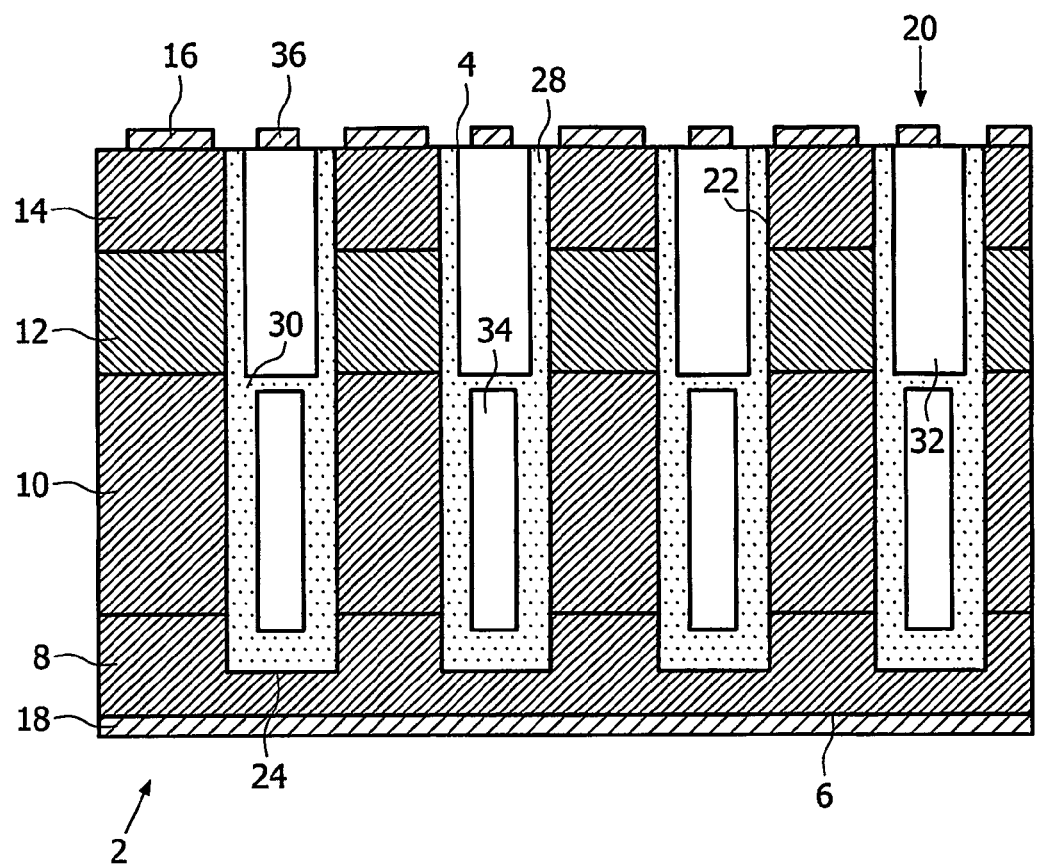
FIG. 3 shows a cross-sectional side view of a second embodiment of a MOSFET according to the invention.

A second embodiment, illustrated in FIG. 3, is identical to the first except for the use of a region of gate insulator 28 of thickness 0.1 micron between the field plate 34 and the sub-channel region 10. The insulator between the gate electrode 32 and body 12 is left at the original thickness of 0.05 micron. The second embodiment gives a value of $R_{ds,on}$ of 1.1 mΩ.mm$^2$ excluding the substrate resistance for a gate-source voltage of 10V and a $Q_{gd}$ value of 2.5nC/mm$^2$ for a drain-source voltage of 12V. This gives a figure of merit of 2.6 mΩ.nC. The threshold voltage remains the same as in the embodiment of FIG. 1. Note that the FOM value shows a similar improvement to the improvement provided by the embodiment of FIG. 1.

The second embodiment, as compared with the first embodiment, provides an improved gate-drain charge density value at the expense of a slightly worse specific on-resistance value. This is due to the thicker oxide which reduces the electron concentration in. the inversion layer in the sub-channel region 10.

It should be noted that the choice of voltage applied to the field plate terminal 38 allows further selection of the optimisation. Applying a lower voltage decreases the carrier density in the inversion layer in the body region 12 and so reduces $Q_{gd}$ and increases $Rd_{ds,on}$.

Figure 4:
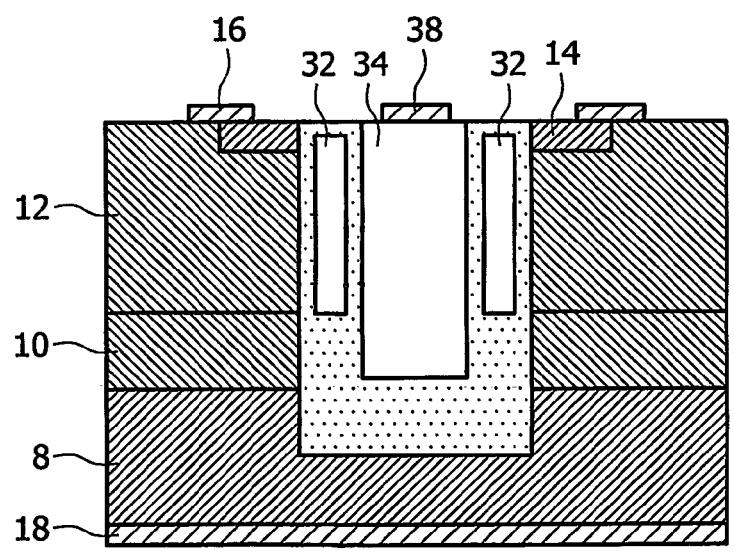
FIG. 4 shows a cross-sectional side view of a third embodiment of a MOSFET according to the invention.

A third embodiment, shown in FIG. 4, is similar in effect to the second embodiment in that it has a thick insulator between the field plate 34 and sub-channel 10. However, instead of a gate arranged above the field plate, the field plate 34 extends in the centre of the trench 20 from the first major surface 4 past the body layer 12 and nearly to the bottom of the sub-channel layer 10. A pair of gates 32 are provided adjacent to the body region 12, one on either side of the field plate 34. The advantage of this arrangement is the lower resistance between the source and field-plate. Indeed, the gates may act as polysilicon spacers during manufacture.

A further feature of the transistor of FIG. 4 that eases manufacture is that the sidewalls of the trench are substantially vertical.

Figure 5:
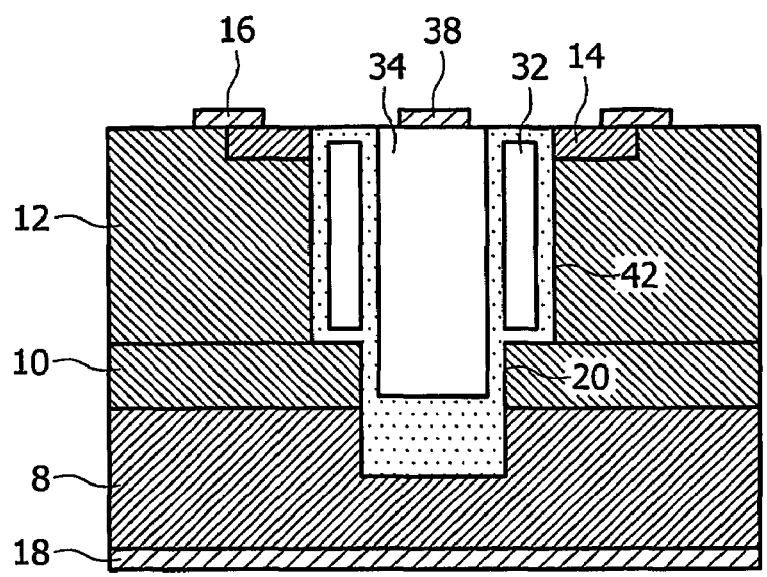
FIG. 5 shows a cross-sectional side view of a fourth embodiment of a MOSFET according to the invention.

The fourth embodiment, illustrated in FIG. 5, is similar to the third embodiment except that the thickness of the insulator between field plate 34 and sub-channel 10 is reduced. The connection of the gates will be done in third dimension (perpendicular to the cross section).

A device according to the fourth embodiment may be manufactured by etching a first trench 42, oxidizing to provide oxide on the sidewalls and base of the trench, and then depositing a layer of polysilicon. Next, an anisotropic etch is performed leaving a polysilicon spacer adjacent each sidewall of the trench 42 to form a pair of gates 32. The oxide exposed on the base of the trench is removed. Next, further trenches 20 are etched by etching silicon, followed by the formation of oxide 28 on the sidewalls of the trench 20, and deposition of polysilicon to form the field plate 34.

Figure 6:
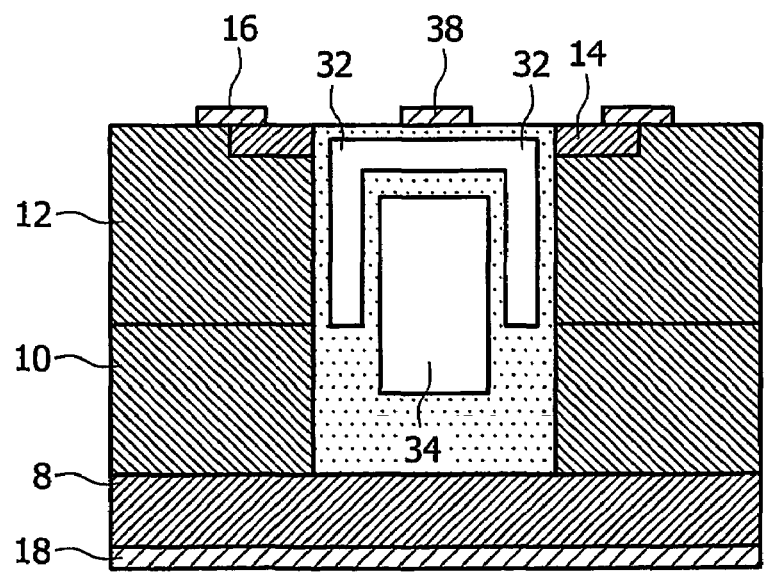
FIGS. 6 and 7 show a cross-sectional side view and a top view, respectively, of a fifth embodiment of a MOSFET according to the invention.
Figure 7:
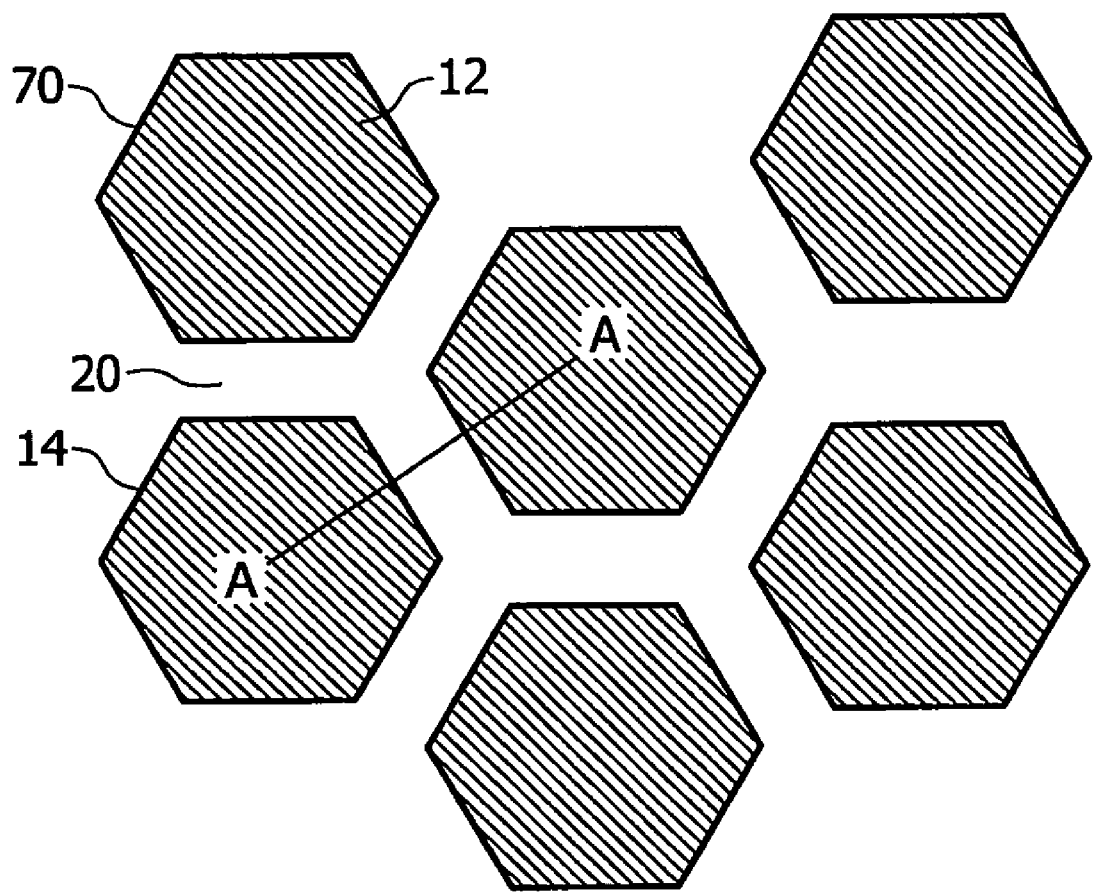

FIGS. 6 and 7 illustrate a further embodiment. As shown in the top view of FIG. 7, a plurality of hexagonal cells 70 having source 12 on top are arranged as a hexagonal array over the first major surface. FIG. 7 also illustrates line A-A where the section of FIG. 6 is taken.

As shown in FIG. 6, the gate 32 has a bridge over the field plate 34. Because the trenches 20 form a continuous array the field plate 34 is continuous and may be contacted outside the active area of the device.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, the oxide dielectric in the trench can be replaced with nitride or oxynitride. This should increase $Q_{gd}$ but decrease $R_{ds,on}$. A low-k material may be used which should have the opposite effect.

Also, although the specific embodiment uses separate gate oxide and trench filler it is also possible to implement the invention using a single dielectric in the trench.

The invention may also be applied in lateral trench MOS-FETs.

Instead of bringing the body to the surface to connect to the source, it is also possible to contact the p-body via a small trench filled with metal ("moat" etch) in the middle of the cell.

The invention may be applied to either p-type or n-type MOSFETs. The p-type and n-type regions in the embodiments described above may in particular be exchanged, so that the regions described as n-type are p-type and the regions described as p-type are n-type.

The invention may use any suitable type of semiconductor, as the skilled person will appreciate. For example, the semiconductor used may be silicon, III-V materials and SiN.

The invention claimed is:

1. An insulated gate field effect transistor, comprising:
a source region of first conductivity type;
a body region of second conductivity type opposite to the first conductivity type adjacent to the source region;
a sub-channel region of second conductivity type adjacent to the body region, wherein the doping in the body region is at least five times higher than the doping in the sub-channel region;
a drain region of first conductivity type adjacent to the sub-channel region, so that body and sub-channel regions are arranged between the source and drain regions;
insulated trenches extending from the source region through the body region and the sub-channel region to the drain region, each trench having sidewalls, and including insulator on the sidewalls, at least one conductive gate electrode adjacent to the body region, and at least one conductive field plate electrode adjacent to the sub-channel region; and
a gate terminal connected to the gate electrodes and a field plate terminal connected to the field plate electrodes to independently control the voltages on the gate electrodes and field plate electrodes.

2. An insulated gate field effect transistor according to claim 1 wherein the thickness of the insulator adjacent to the field plate electrode is greater than the thickness of the insulator adjacent to the gate electrode.

3. An insulated gate field effect transistor according to claim 1 wherein each trench includes a field plate electrode extending alongside the body region and sub-channel region and a pair of gate electrodes, one on each side of the field plate electrode, adjacent to the body region.

4. An insulated gate field effect transistor according to claim 1 wherein the doping concentration in the sub-channel region is in the range of about $1 \times 10^{15}$ cm$^{-3}$ to about $1 \times 10^{16}$ cm$^{-3}$ and the doping concentration in the body region is in the range of about $5 \times 10^{16}$ cm$^{-3}$ to about $1 \times 10^{18}$ cm$^{-3}$.

5. An insulated gate field effect transistor according to claim 1 wherein the doping concentration in the sub-channel region is graded to be higher adjacent to the body region and lower adjacent to the drain region.

6. An insulated gate field effect transistor according to claim 1 having a semiconductor body having opposed first and second major surfaces,
wherein the source region is at the first major surface over the body region, the body region is over the sub-channel region and the sub-channel region is over the drain region, and
the trench extends from the first major surface towards the second major surface through the source, body and sub-channel regions.

7. An insulated gate field effect transistor according to claim 6 wherein the gate is formed of a pair of polysilicon spacers on either side of the field plate electrode.

8. An insulated gate field effect transistor according to claim 6 having an array of cells arranged over the first major surface, the cells including the source region, body region and sub-channel region, and a network of trenches around the cells.

9. Use of an insulated gate field effect transistor, comprising:
a source region of first conductivity type;
a body region of second conductivity type opposite to the first conductivity type adjacent to the source region;
a sub-channel region of second conductivity type adjacent to the body region,
wherein the doping in the body region is at least five times higher than the doping in the sub-channel region;
a drain region of first conductivity type adjacent to the drift region, so that body and drift regions are arranged between the source and drain regions;
insulated trenches extending from the source region through the body region and into the sub-channel region, the trenches having sidewalls, and including insulator on the sidewalls, at least one conductive gate electrode adjacent to the body region and at least one conductive field plate electrode adjacent to the sub-channel region; and a gate terminal connected to the gate electrode and a field plate terminal connected to the field plate electrode to independently control the voltages on the gate electrode and field plate electrode, the use comprising the steps of:
applying a voltage to the field plate terminal, the voltage being selected to create an inversion layer in the sub-channel when the transistor is on; and
applying a varying gate voltage to the gate terminal to switch the transistor on and off.

* * * * *